United States Patent [19]
Hall et al.

[11] Patent Number: 5,608,745
[45] Date of Patent: Mar. 4, 1997

[54] SLAB WAVEGUIDE LASER

[75] Inventors: Denis R. Hall, East Lothian; Howard J. Baker; Alan D. Colley, both of Edinburgh; Krzysztof M. Abramski, West Lothian, all of England

[73] Assignee: Lumonics Limited, Rugby, England

[21] Appl. No.: 178,262

[22] PCT Filed: Jul. 1, 1992

[86] PCT No.: PCT/GB92/01186
  § 371 Date: May 3, 1994
  § 102(e) Date: May 3, 1994

[87] PCT Pub. No.: WO93/01635
  PCT Pub. Date: Jan. 21, 1993

[30] Foreign Application Priority Data

Jul. 1, 1991 [GB]  United Kingdom .................. 9114148

[51] Int. Cl.$^6$ ........................................ H01S 3/10
[52] U.S. Cl. ............................................. 372/26; 372/18
[58] Field of Search ................... 372/26, 18, 19, 372/41, 102, 103

Primary Examiner—Rodney B. Bovernick
Assistant Examiner—Robert E. Wise
Attorney, Agent, or Firm—Nixon & Vanderhye, P.C.

[57] ABSTRACT

A slab waveguide laser which provides efficient operation in predominantly a single mode operation includes a periodic modulation structure positioned between a slab waveguide and one of two cavity mirror reflectors. Alternatively, the periodic modulation structure may be included along the slab face. The periodicity of the periodic modulation structure is determined by the width of the waveguide to ensure that the periodic modulation is coherently self-imaged in one (or more) round trip(s) of the laser cavity. Because of the low loss propagation within the slab waveguide, overall cavity losses are minimized in both the lateral and transverse directions of the slab.

23 Claims, 15 Drawing Sheets

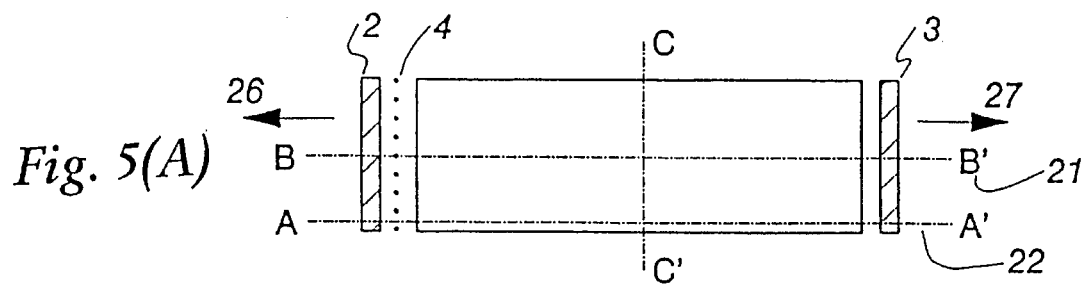
*Fig. 5(A)*
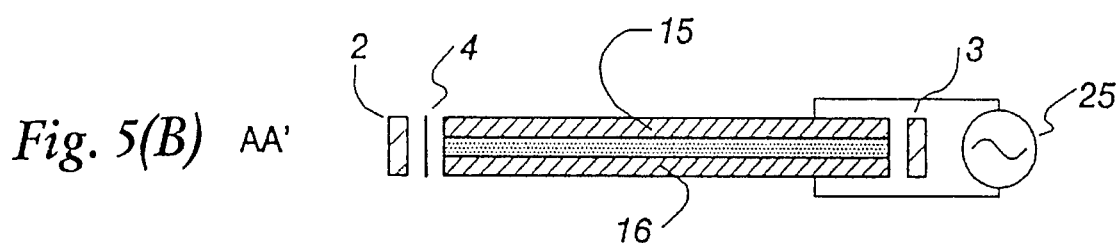
*Fig. 5(B)* AA'
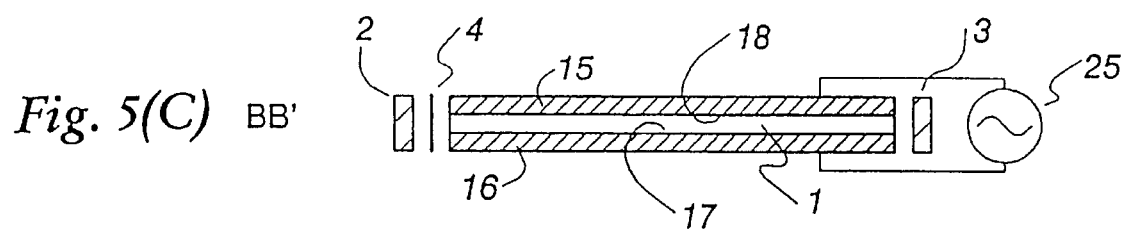
*Fig. 5(C)* BB'
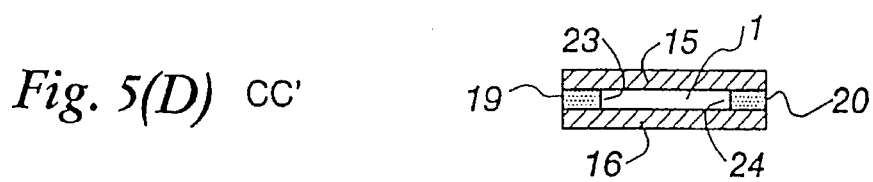
*Fig. 5(D)* CC'
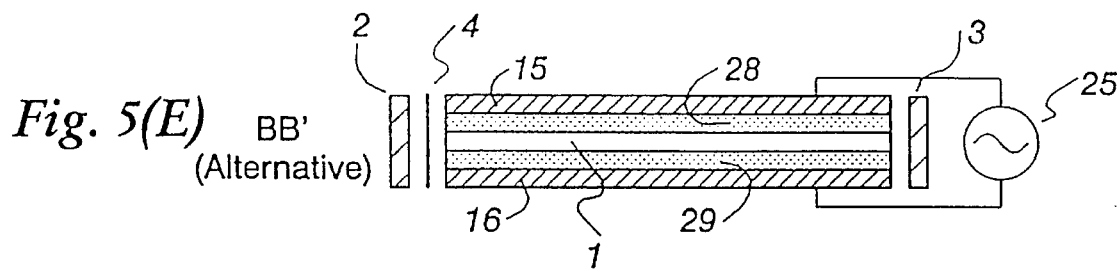
*Fig. 5(E)* BB'
(Alternative)

Fig. 10(A)
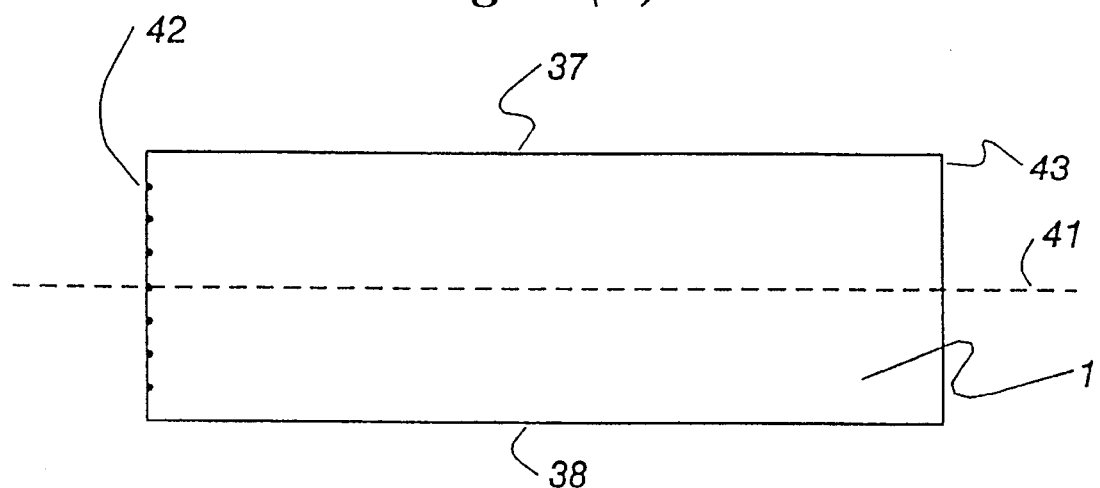
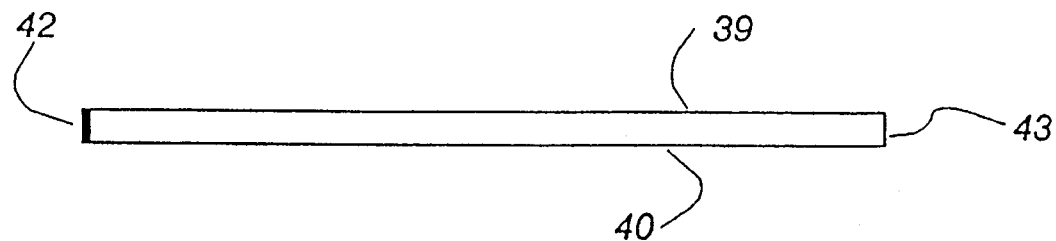
Fig. 10(B)

SLAB WAVEGUIDE LASER

FIELD OF THE INVENTION

The present invention relates to lasers and particularly to lasers such as gas, liquid or solid state lasers employing slab-shaped gain media, wherein the mechanical structure which confines or constitutes the gain media also acts as an optical waveguide. More specifically, the present invention relates to a slab waveguide laser which provides efficient operation in a predominantly single, high-order mode at high levels of output power.

BACKGROUND OF THE INVENTION

It is well known in the laser field that lasers may employ gain media with one or other forms of large area geometry. In one known example of a large area gain medium, the axial dimension thereof is some multiple of the width, which in turn is substantially larger than the thickness, so forming a slab of rectangular cross-section. U.S. Pat. No. 4,719,639 by Tulip and U.S. Pat. No. 4,930,138 by Opower, both describe carbon dioxide lasers employing slab-shaped gain media. In both cases large planar metal or dielectric surfaces are provided at the boundaries of the slab-shaped gain media and the dimensions of the slab-shaped gain media are such as to allow optical waveguiding between these surfaces. For convenience such an arrangement is referred to herein and by those skilled in the art as a slab waveguide.

It is well known that the successful use of high power lasers for applications such as material processing and laser radar depends on achieving high optical quality in the beam generated by the laser. In a slab waveguide laser, the physical separation of the major planar surfaces defining the optical waveguide is usually selected so that the component of the optical field in the direction at right angles to these surfaces (the transverse direction) propagates in a low-order mode of the waveguide. Thus, for example, surface separations in the approximate range of 0.5 mm–3.0 mm are suitable for low-order waveguide propagation of radiation at the 10 microns wavelength produced by carbon dioxide lasers.

It is also essential to achieve adequate control over the characteristics of the intra-cavity optical field in the plane parallel to the major planar surfaces of the optical waveguide (the lateral direction), if a laser output beam exhibiting the required propagation and focusing characteristics is to be obtained. The lateral modes of a slab waveguide laser are well described by high order rectangular waveguide modes, but in general an incoherent mode mixture is observed with multiple output frequencies. A single high order mode can only be observed at much reduced output power, by substantially increasing the cavity losses.

It is well-known that if a coherent optical field is incident upon a periodic transverse (grating-like) structure, the optical field distribution at the structure will be exactly reproduced at other planes transverse to the axis of propagation located at distances that are integer multiples of the distance $Z_T$ given by:

$$Z_T = \frac{2nd^2}{\lambda} \quad (1)$$

where $Z_T$ is referred to as the Talbot distance, d is the spacing of the individual apertures in the periodic transverse structure, $\lambda$ is the wavelength, and n is the refractive index of the medium. This is referred to as the Talbot effect. The Talbot effect produces successive images without the aid of lenses.

This so-called coherent imaging property of periodic structures has been used in the prior art as the basis of a technique for producing phase-locked or coherent operation of an array of multiple individual adjacent parallel laser oscillators, spatially arranged in a one-dimensional or two-dimensional geometric configuration. In such cases, phase-locking of the array elements has been achieved by arranging that light from a given element of an array of laser gain media couple into adjacent elements by diffraction within a common extended laser cavity. By selecting the round trip distance from the output plane of the array elements to the common laser mirror, which constitutes the diffractive coupling zone, to be a Talbot half distance or multiple thereof, the periodic field in the output plane of the array is re-imaged back upon itself after the round trip to the laser mirror. Thus, it is possible to increase the effectiveness of diffractive coupling between the array elements because of the self-imaging properties associated with the Talbot effect.

SUMMARY OF THE INVENTION

It is an object of the present invention to provide a slab waveguide laser which exhibits a high degree of spatial uniformity while simultaneously providing an output beam of high optical quality. It is a further object of the present invention to provide a high power slab waveguide laser which provides a high quality coherent output.

The slab waveguide laser in accordance with the present invention exploits the principles of coherent imaging of waveguide modes to produce a predominantly single, high-order mode operation at high output power levels. In this regard, the slab waveguide laser relies upon the mode propagation characteristics of electromagnetic fields in a slab waveguide and the coherent imaging characteristics exhibited by periodic modulation structures when illuminated by coherent light.

According to a first aspect of the present invention there is provided a slab waveguide laser which operates in a predominantly single high-order mode. A slab waveguide consists of a rectangular-section slab-shaped gain medium having two orthogonal pairs of parallel side walls which are highly reflective at glancing incidence at the laser wavelength and respectively define the width (lateral direction) and thickness (transverse direction) of the slab waveguide, two parallel end faces that are orthogonal to the side walls, and a main optical axis running parallel to the side walls. Two laser resonator mirrors, at least one of which is partially transmitting, are positioned adjacent to a respective end face of the slab waveguide and orthogonal to the main optical axis thereof to define therebetween a laser cavity.

A periodic modulation structure is positioned within the laser cavity and orthogonal to the main optical axis of the slab waveguide, with at least one direction of periodic modulation parallel to the lateral direction of the slab waveguide. The length L of the laser cavity obeys the formula:

$$L = m \frac{nd^2}{2\lambda}$$

where m is a positive integer, d is the spacing (periodicity) of apertures that comprise the periodic modulation structure, $\lambda$ is the laser wavelength and n is the refractive index of the gain medium. The width of the slab waveguide is an integer multiple of the spacing d of the periodic modulation struc- The slab waveguide laser according to the first aspect of the invention has particular applicability to the case where waveguiding, as opposed to free space Gaussian propagation, occurs both in the transverse and lateral directions of the slab waveguide. The output beam from a simple slab waveguide laser consists of a superposition of many different waveguide modes, whose amplitudes and frequencies vary in accordance with the spacing and alignment of the resonator mirrors, resulting in an output beam which exhibits poor spatial and temporal coherence.

In this application, two related techniques for stabilization of the internal mode content of a slab waveguide laser are described, such that the output laser beam is predominantly in a single, high-order mode, which can be converted if necessary, external to the laser cavity by passive optical means, to a desirable beam format in terms of its far-field intensity distribution. Such passive optical means are, for example, phase correction by binary phase shifters (of the generic type described by J. R. Leger, G. J. Swanson and V. B. Veldkamp in Applied Optics, 26, 4391 (1987)) or beam re-formatting by segmented mirror.

The first technique for stabilization of a slab waveguide laser to select a predominantly single, high-order waveguide mode relies upon spatial modulation of one or both of the laser resonator mirrors and the principle of coherent imaging.

In the first technique, one or both of the laser resonator mirrors at the ends of the laser cavity is divided into zones across the lateral direction of the slab waveguide, with each zone being of width d=w/q, where w is the lateral width of the slab waveguide and q is an integer number corresponding to the desired lateral mode. The or each laser resonator mirror is divided into zones by the periodic modulation structure. The periodic modulation structure may take various forms, but for ease of understanding it may be thought of simply as a grid of thin, parallel wires. The width of particular zones may be adjusted to compensate for optical non-uniformities in the gain medium.

In the following explanation, reference is made to the grid of wires placed in front of one of the laser resonator mirrors as being representative of the general principles of operation, but it will be understood that a similar explanation applies to the other forms of periodic modulation structure described hereinbelow.

It is well known that a laser oscillator will self-adjust its intra-cavity field to produce maximum output in the presence of localized optical losses, such as those induced by the grid of wires. In accordance with the first aspect of the present invention, this requires the laser to adopt a predominant spatial (lateral) mode whose periodicity matches that of the grid of wires, i.e., the $EH_{1q}$ waveguide mode. Other lateral modes are intercepted by the wires of the grid and are suppressed because of the increased cavity losses for these modes.

However, to discriminate strongly against unwanted modes, the wires must be of such a thickness that they also provide finite loss for the required mode so reducing the laser output power in that mode. This loss of power in the desired mode caused by the grid of wires is compensated by spacing the laser resonator mirrors so as to satisfy the condition of coherent imaging. The coherent imaging condition for a slab waveguide requires that the laser cavity length L should obey the relation:

$$L = m \frac{n d^2}{2\lambda} \quad (2)$$

where m is a positive integer, d is the spacing of the wires in the grid, $\lambda$ is the laser wavelength, and n is the refractive index of the gain medium. The distance 2L corresponds to the so-called round trip distance in the laser cavity and is equal to a multiple of the Talbot half distance ($Z_T/2$) as defined in equation (1) above.

When the coherent imaging condition of equation (2) is satisfied, all waveguide modes which are odd harmonics of the fundamental mode are of equal frequency and operate as a phase-locked superposition. Moreover, the in-cavity field amplitude adjusts itself to avoid coupling power into the wires. Coherent imaging thus facilitates the selection of predominantly single, high-order mode operation without incurring excessively high cavity losses.

The periodic modulation structure (wire grid) described above provides mode control in one dimension of the slab waveguide, that is in the lateral direction. However, where the thickness of the slab waveguide is greater than that necessary to ensure a single waveguide mode in the transverse direction, the periodic modulation structure can be modified to account for this. In this regard, the periodic modulation structure, which may conveniently take the form of a grid of crossed wires, divides each laser resonator mirror into square or rectangular zones. The lateral width of each zone is d=w/q as indicated hereinabove. The transverse thickness of each zone is d'=w'/p where w' is the transverse thickness of the slab and p is an integer number corresponding to the desired transverse mode. Now the coherent imaging condition of equation (2) is simultaneously satisfied for the zone dimensions in both transverse and lateral directions, and the predominant mode now selected takes the form $EH_{pq}$, where p is an integer greater than unity.

A second technique for stabilization of a slab waveguide laser to select a predominantly single, high-order waveguide mode is based on modulation of the widest of the reflective side walls (major surface) of the slab waveguide and the principle of coherent imaging.

As before, the periodicity of the lateral modulation is given by d =w/q. The lateral periodic modulation structure takes the form of grooves or raised sections formed on the major surface(s) of the slab waveguide. The width of these grooves or raised sections is less than d. The grooves or raised sections can be applied to either just one of the side walls, or to both with accurate registration and alignment of the patterns on the respective opposite faces.

Modulation of the widest of the reflective side walls of the slab waveguide may be restricted to only short sections (zones) of the total length of the slab waveguide, the zones being spaced apart by a distance equal to the Talbot half distance $Z_T/2$, as defined by equation (1), or integer multiples thereof. The round trip distance 2L in the laser cavity must be some multiple of the Talbot half distance with the zones being correctly positioned for coherent imaging. This ensures that spatial harmonics of the fundamental $EH_{1q}$ mode form a coherent superposition, as in the first technique, using a periodically modulated laser resonator mirror. This coherent superposition, predominantly $EH_{1q}$, has reduced cavity loss and results in increased output power from the slab waveguide laser.

A second aspect of the present invention provides phase-locked operation of an array of laser oscillators. A multi-element array of gain media has outputs which lie in a common plane. A slab waveguide consists of a slab-shaped medium, one end of which is positioned immediately adjacent to the common output plane of the multi-element array of gain media, and a pair of laser cavity mirrors. The first mirror is positioned adjacent to the distal end face of the slab waveguide, and the second mirror is positioned adjacent to the distal end face of the said multi-element array of gain media. The side walls of the slab waveguide are highly reflective at glancing incidence for the laser wavelength to provide a region wherein diffractive coupling of the radiation emitted from said multi-element array of gain media occurs under conditions of very low optical loss in both the transverse and lateral directions. The distance between the output plane of the said multi-element array of gain media and the said first mirror obeys the formula:

$$L = m \frac{n d^2}{2\lambda}$$

where m is a positive integer, d is the spacing of the gain media in the multi-element array, λ is the laser wavelength and n is the refractive index of the slab waveguide medium.

In contrast to using coherent imaging in free-space to produce phase-locked operation of a multi-element array of gain media, the laser system according to the second aspect of the present invention makes use of the Talbot effect to coherently couple the modes of the slab waveguide and thereby to achieve phase-locked operation of the array by virtue of coherent imaging in the slab waveguide. Moreover, the laser system according to the second aspect of the present invention allows control of the propagating waveguide mode in the lateral direction.

BRIEF DESCRIPTION OF THE DRAWINGS

Embodiments of the present invention will be described, by way of example, with reference to the accompanying drawings, in which:

FIGS. 5(a) to (d) show various views of an electric discharge slab waveguide laser employing 5 the first mode stabilization technique;

FIG. 5(e) shows a variation on the design of the electric discharge slab waveguide laser of FIGS. 5(a) to (d);

FIG. 10 shows a slab waveguide consisting of a solid state material, to which the principle of the first aspect of the invention is applied, as a monolithic structure, by means of a suitable periodic modulation structure;

DETAILED DESCRIPTION OF PREFERRED EMBODIMENTS

Figure 2A:
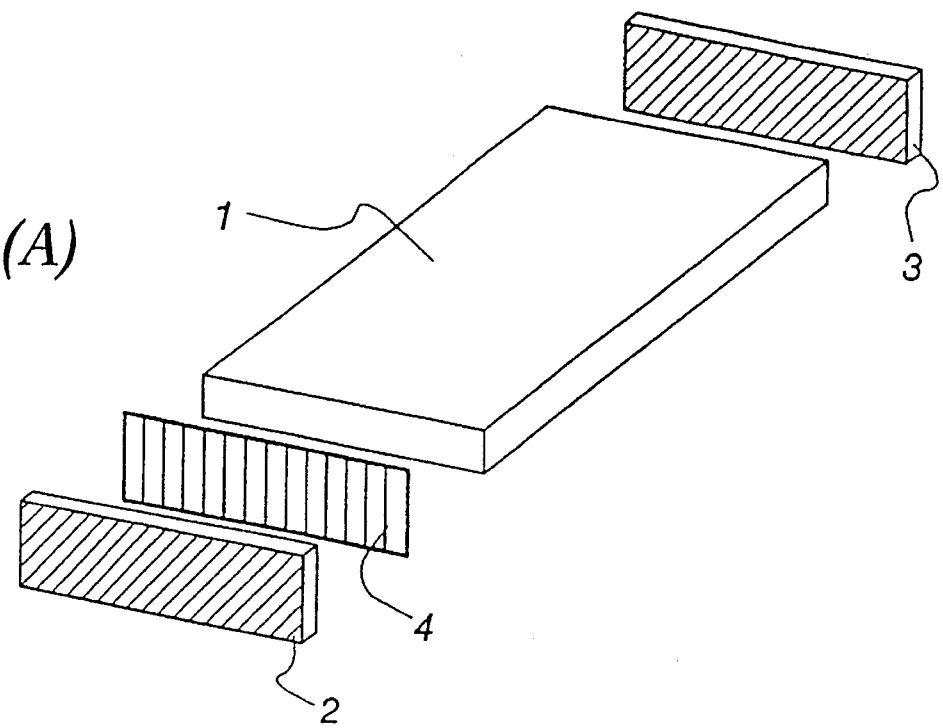
FIGS. 2(a) and (b) are schematic diagrams illustrated the first and second techniques for achieving mode stabilization in a slab waveguide laser according to the first aspect of the invention.
Figure 4A:
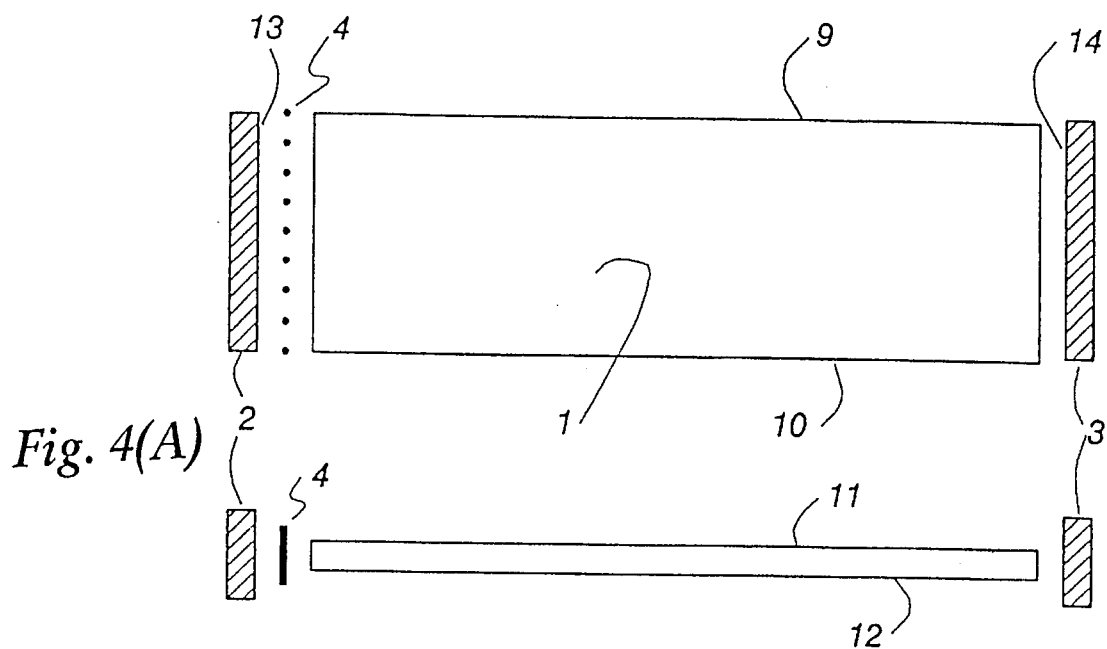
FIGS. 4(a) and (b) show two examples of the first mode stabilization technique with laser resonator mirrors adjacent to and co-incident with the end faces of a slab waveguide.
Figure 4B:
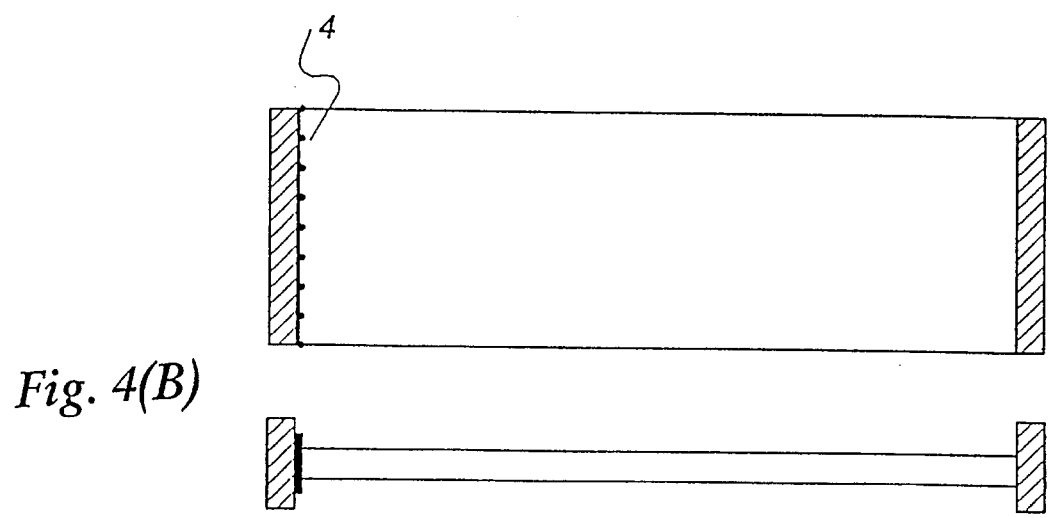

The geometry of a slab waveguide laser according to the first aspect of the present invention is illustrated in FIGS. 2(a) and 4. A rectangular slab shaped waveguide laser gain medium 1, (hereinafter referred to as a slab waveguide) configured for optical waveguiding, is positioned between a pair of laser resonator mirrors 2,3 which define in the space between them a laser cavity. The mirrors 2,3 may be closely adjacent to, as in FIG. 4(a), or coincident with, as in FIG. 4(b), the ends of the slab waveguide 1. The side walls or surfaces 9 and 10, as well as the top walls or surfaces 11 and 12, of the slab waveguide 1 are highly reflecting at glancing incidence at the laser wavelength.

As can be seen in FIGS. 2(a) and 4(a) a grid of thin, parallel wires 4, made from a metal (such as gold, for example) or other suitable material, is positioned in the small space separating one end of the slab waveguide 1 from the adjacent mirror 2. In FIG. 4(b) the wire grid 4 is sandwiched between the end of the slab waveguide 1 and the coincident mirror 2.

As an alternative to the wire grid 4, an array of thin parallel plates or foils may be used. The plates or foils, which are oriented parallel to the laser cavity axis and positioned within the laser cavity in a manner similar to the grid of wires, offer increased mechanical strength. The wires or foils are arranged to be equidistant from the mirror 2 and orthogonal to the major surfaces of the slab waveguide, i.e., the top surfaces 11 and 12. The front surfaces 13 and 14 of the mirrors 2 and 3 are coated so as to be reflective 5 at the laser wavelength, thereby ensuring efficient laser operation.

The mirror 2 is divided into q zones across the lateral direction of the slab waveguide 1 by the wire grid 4, with each zone being of width d=w/q, where w is the lateral width of the slab waveguide 1.

The width w of the slab waveguide 1 is usually chosen to be some convenient multiple of the slab waveguide thickness to facilitate the excitation of the $EH_{1q}$ mode. The thickness of the slab waveguide is chosen to ensure operation in a fundamental waveguide mode in the transverse direction.

In order to compensate for the loss of power at the desired high-order mode $EH_{1q}$ caused by the wire grid 4, the length L of the laser cavity is chosen to produce the condition of coherent imaging. The coherent imaging condition for a slab waveguide requires that the cavity length should be in accordance with equation (2) hereinabove.

Figure 1A:
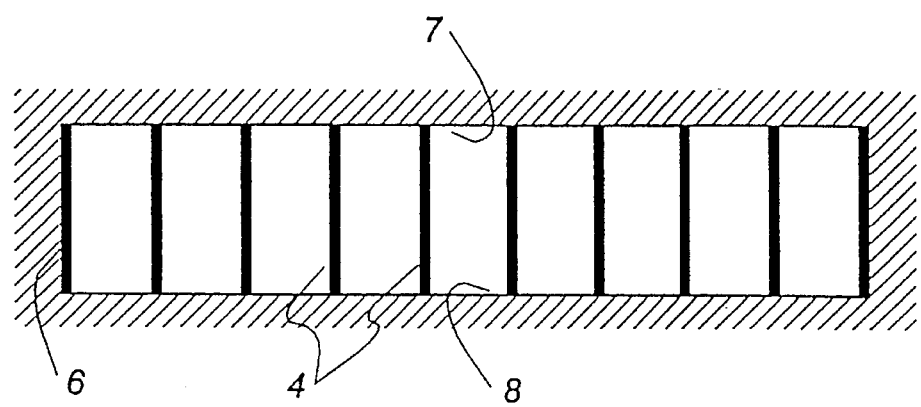
FIG. 1 (a) shows an end view of a slab waveguide laser according to the first aspect of the present invention.
FIG. 1(b) shows the electric field amplitude at the end of the laser cavity where the wire grid is located.
Figure 1B:
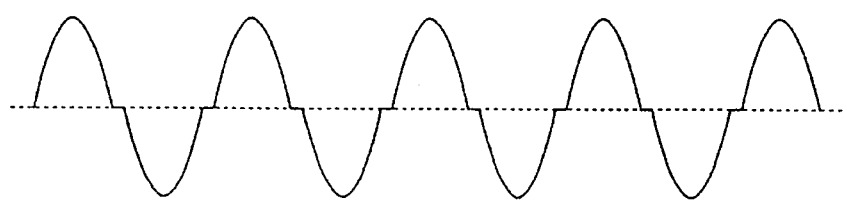

When coherent imaging occurs, all waveguide modes which are odd harmonics of the fundamental mode are of equal frequency, and operate as a phase-locked superposition. For the case of a grid of wires 4, placed in front of a mirror 2, as in the arrangement shown in FIG. 2(a), the intra-cavity field amplitude self-adjusts to avoid coupling power into the wires. This is illustrated schematically in the 5 diagram in FIG. 1(b) which shows zero field regions in the positions corresponding to the wire locations. The use of coherent imaging thus facilitates predominantly single high-order mode operation without incurring significant cavity losses.

FIGS. 5(a) to 5(d) show different views of an electric discharge slab waveguide laser consisting of an electric discharge excited gas mixture, such as that suitable for a carbon dioxide laser, which is excited by a transverse radio frequency discharge. The discharge is maintained between a pair of fluid-cooled metal electrodes 15,16. The upper surface 17 of the lower electrode 16 and the lower surface 18 of the upper electrode 15, are designed to be highly reflective at glancing incidence at the laser wavelength, and act as optical waveguide surfaces. The sides of the slab waveguide 1 consist of ceramic spacers 19,20, which are ground or polished to be highly reflective at glancing incidence at the laser wavelength on their internal surfaces 23,24 and also act as optical waveguide surfaces. The gas mixture 1 confined between the electrodes 15 and 16 and the ceramic spacers 19 and 20 is the gain medium of the laser. The separation of the electrodes 15,16 in the case of the carbon dioxide slab waveguide laser may be in the approximate range of 0.5 mm–3.0 mm. The gas 5 mixture 1 between the electrodes 15,16 contains a suitable mixture of helium, nitrogen, carbon dioxide and other suitable gas additives for the efficient operation of a carbon dioxide laser, excited by a transverse radio frequency electric field produced by a suitable R.F power generator 25.

A laser resonator mirror 2,3 is provided at each end of the waveguide structure defined by electrodes 15, 16, spacers 19, 20 and gas mixture 1, and a wire grid 4 is provided between mirror 2 and the adjacent end of the waveguide structure. The output beam 26,27 from the laser may be taken through either or both of the mirrors.

Operation of the slab waveguide laser to provide a predominantly single, high-order mode of operation is as previously described with reference to FIGS. 2(a) and 4.

FIG. 5(e) shows an electric discharge slab waveguide laser similar to that shown in FIGS. 5(a) to (d), but in which the cooled metal R.F electrodes 15, 16 are separated from the gas discharge volume 1, by dielectric strips 28, 29 which serve as optical waveguide surfaces.

Figure 6:
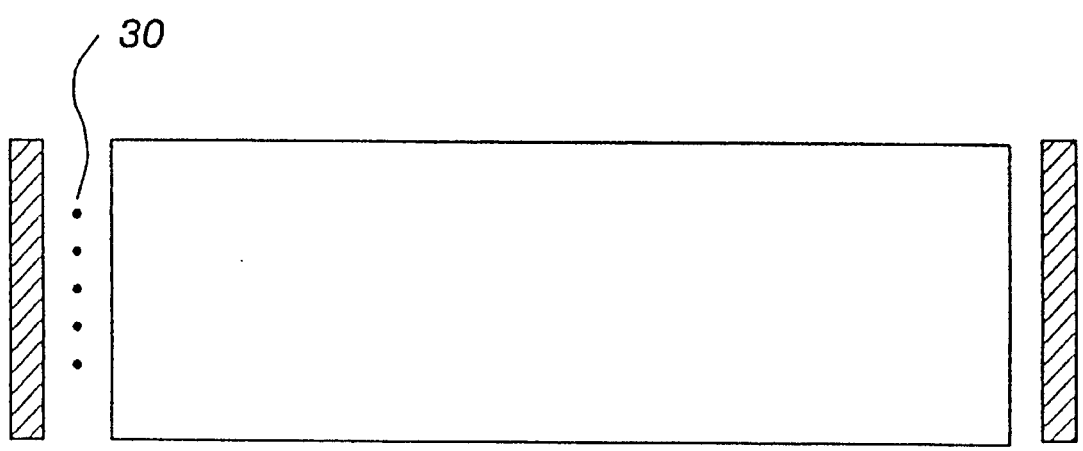
FIG. 6 shows a modified periodic modulation structure in which the periodic modulation structure accordance with the first technique in which the periodic modulation structure extends over only part of the lateral width of the slab waveguide.

FIG. 6 shows a variation on the slab waveguide laser of FIG. 2(a) and FIGS. 4(a) and (b) comprising a wire grid 30, with wire separation chosen as before, but which extends over only the central region of the slab waveguide. Although this results in a reduced number of periodic apertures, there will still be sufficient effective mode filtering to induce the laser to operate predominantly in the $EH_{1q}$ mode.

Figure 7A:
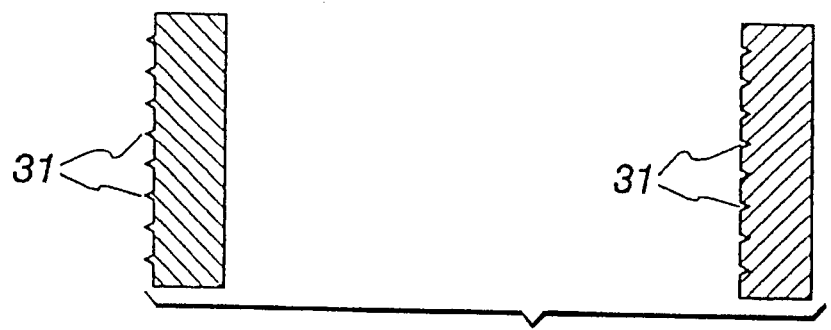
FIGS. 7(a) and (b) show further examples of the periodic modulation structure used in the first technique which consists of lines, grooves or raised portions etched or otherwise marked on one or both of the laser resonator mirrors.
Figure 7B:
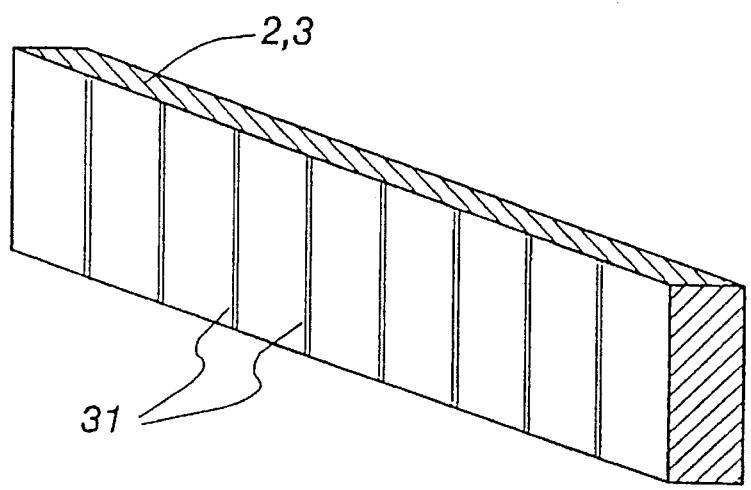

FIGS. 7(a) and (b), illustrate a modification to one (or both) of the laser resonator mirrors 2,3 which allows the wire grid 4 to be dispensed with. In place of the wire grid, a grid of parallel equispaced lines 31, is deposited on, or etched in, the surface of the or each mirror. For a carbon dioxide laser, these etched lines are approximately 50 microns thick. The mirror substrate is then coated with a multi-layer coating to produce the desired reflectivity. The grid of lines 31, on the mirror(s) 2,3 controls the lateral mode structure in the same way as the wire grid 4 described previously hereinabove. The periodicity of the grid of lines 31 is determined using the same criteria as for the wire grid 4 described previously hereinabove.

Figure 8:
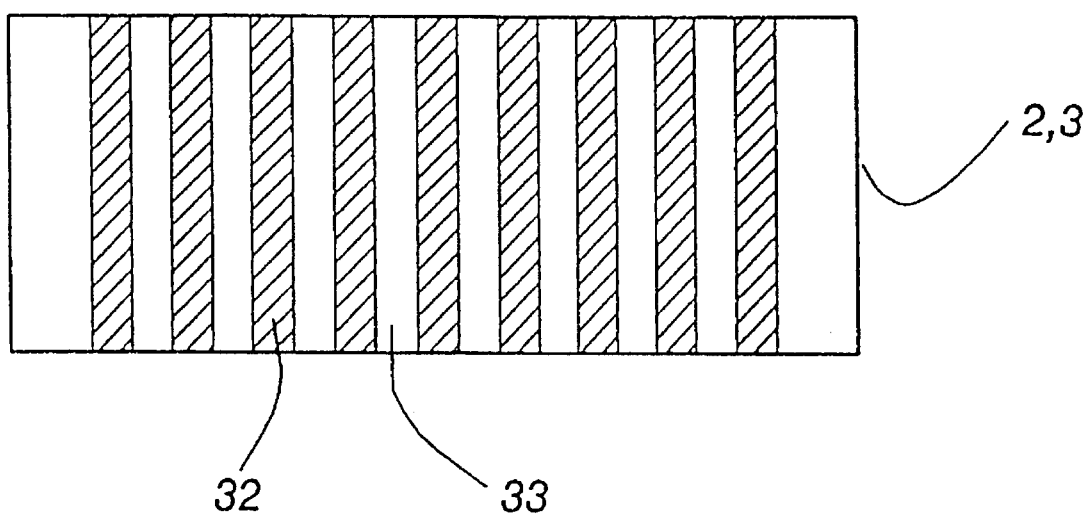
FIG. 8 shows yet a further example of the periodic modulation structure used in the first technique consisting of alternating coating zones of different reflectivity on one or both of the laser resonator mirrors.

In yet another variation to replace the wire grid 4, the reflectivity of the or each laser resonator mirror 2,3 is varied periodically across its width. As shown in FIG. 8, alternate zones of reflectivity 32,33 simulate the periodicity of the equivalent wire grid. This particular arrangement differs from the acknowledged prior art of U.S. Pat. No. 4,884,282 by W. B. Bridges, in that the periodicity of the alternate zones of reflectivity is determined by the requirement to satisfy the conditions for coherent imaging in a slab waveguide, rather than being matched to the periodicity of an array of laser gain media.

Figure 2B:
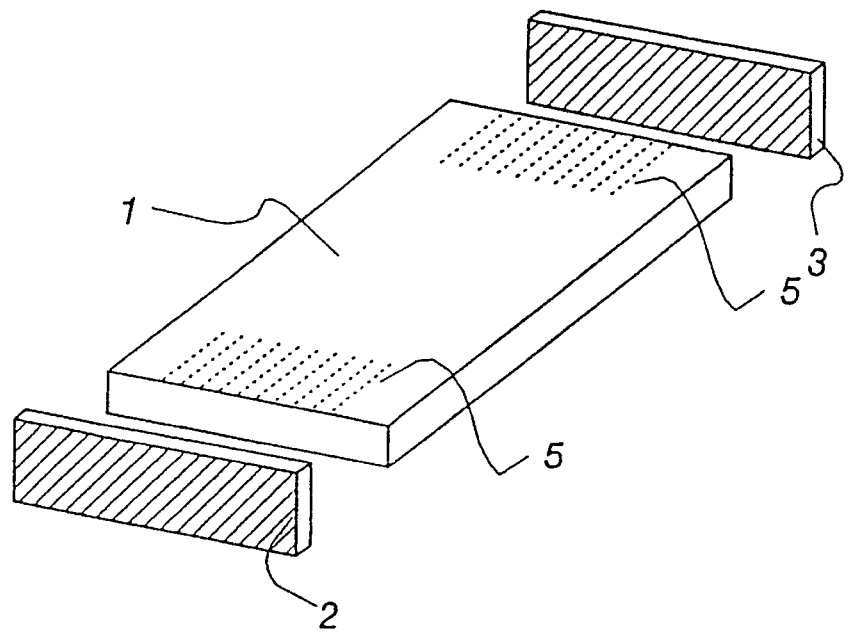
Figure 3A:
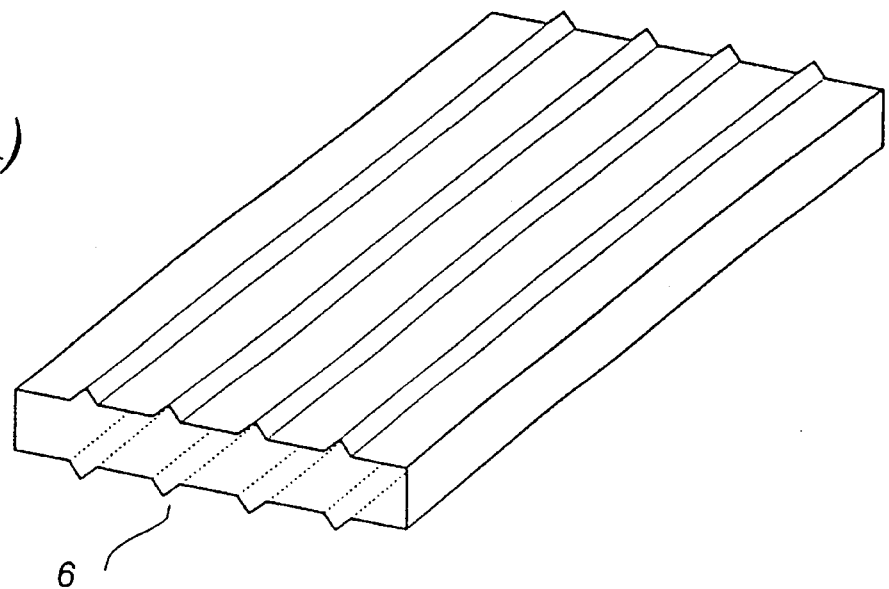
FIGS. 3(a) and (b) show two examples of the second mode stabilization technique.
Figure 3B:
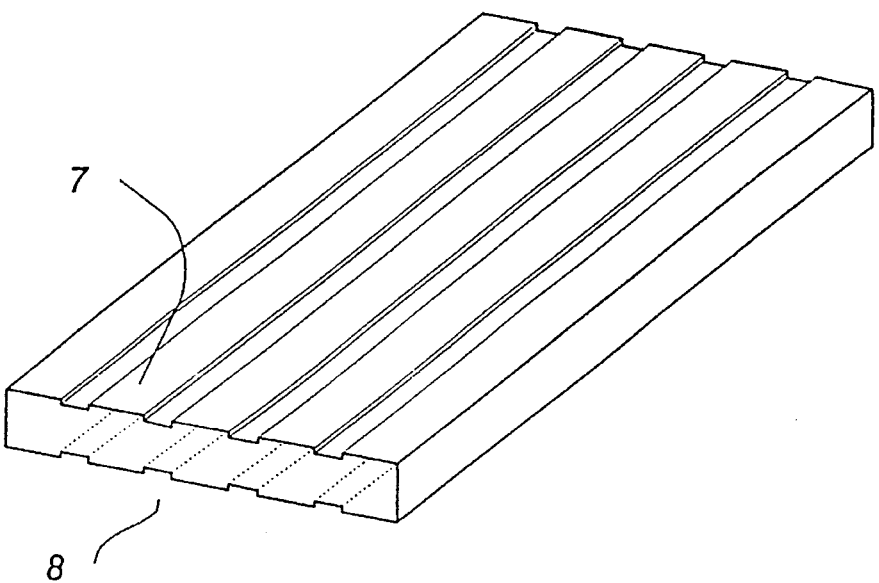

The second technique for stabilization of a slab waveguide laser in accordance with the first aspect of the present invention to select a predominantly single, high-order waveguide mode, uses periodic lateral modulation of the widest of the radiation-confining walls or surfaces of the slab waveguide 1, as illustrated schematically in FIG. 2(b). Two examples of this approach are illustrated schematically in FIGS. 3(a) and (b). The periodicity of the lateral modulation is given by d=w/q where w is the width of the slab waveguide 1 and q is an integer number. As shown in FIG. 3(a), the modulation takes the form of narrow raised sections 6. In the form shown in FIG. 3(b), the modulation alternatively takes the form of relatively narrow grooves 8. In both cases, the periodic modulation may be applied to either just one of the major slab waveguide walls, or to both opposing walls, with accurate registration and alignment of the patterns on the respective faces.

Modulation of the widest of the walls may usefully be restricted to only short sections (zones) of the total length of the slab waveguide 1, the zones being spaced from each other by a distance equal to the 5 Talbot half distance, $Z_T/2$ or integer multiples thereof. Moreover, the length of the slab waveguide 1 should be a multiple of the Talbot half distance, and the zones positioned to satisfy the conditions for coherent imaging. Such registration allows spatial harmonics of the fundamental $EH_{1q}$ mode to form a coherent superposition as for the case of a periodically modulated resonator mirror. This coherent superposition, dominated predominantly by the $EH_{1q}$ mode, has reduced cavity loss and results in high output power from the slab laser.

Figure 9A:
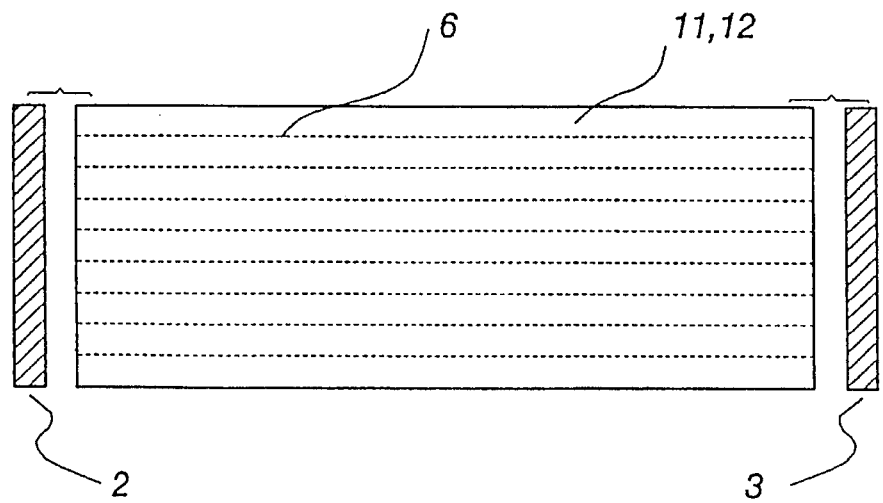
FIGS. 9(a) and (b) show examples of the periodic modulation structure in accordance with the second technique, consisting of lines, grooves or raised portions formed on the major side walls of the slab waveguide.

FIG. 9(a), shows a slab waveguide laser in which lines, grooves or raised portions 6, are provided on the major planar surfaces 11,12 of the slab waveguide.

Figure 9B:
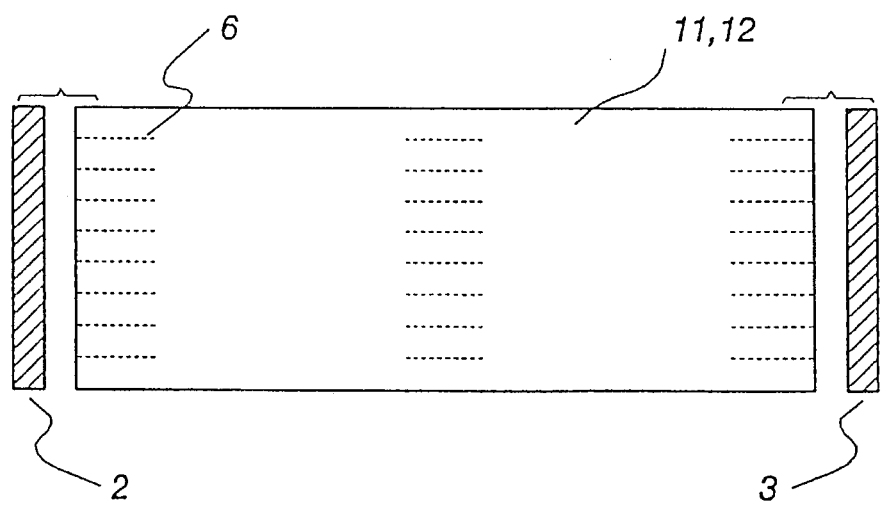

FIG. 9(b) shows an identical slab waveguide laser to that of FIG. 9(a) except that the lines, grooves or raised portions 6 which provide modulation are broken up into short sections (zones) of the total length of the slab waveguide. Each zone is spaced from its immediate neighbor by a distance equal to the Talbot half distance, $Z_T/2$ or integer multiples thereof. This embodiment may be realized, for example, in the case of a carbon dioxide slab laser, by suitably machining the slab waveguide surfaces, as illustrated in detail in FIGS. 3(a) and (b). Alternatively, as for example in the case of a solid state laser, the lines, grooves or raised portions may be etched or otherwise transferred 5 to the major planar surfaces.

As shown in FIGS. 3(a) and (b) the major planar surfaces 7,8 of the slab waveguide exhibit either wide alternating grooves or wide alternating raised sections whose dimensions are chosen such that:

$$d1+d2=2w/q$$

where w is the width of the slab waveguide and q is an integer. In this modulation format, the value of d is set equal to ½ (d1+d2).

The first aspect of the present invention can be used to produce mode stabilization in slab waveguide solid state lasers, where the gain medium is one of the well-known crystal or glass materials, such as neodymium:YAG, neodymium:glass, alexandrite or other suitable laser materials of this general type. All of the design variations described hereinabove with reference to FIGS. 1 to 4 and FIGS. 6 to 9 can be employed with solid state slab waveguides. However, in addition a monolithic design as shown in FIG. 10 can be employed. The slab waveguide 1, has all six faces optically polished with side faces 37,38 and 39,40 parallel to each other and to the principal laser axis 41, and also orthogonal to the end faces 42,43. The end faces are coated with multi-layer dielectric coatings of suitable reflectivity for efficient laser action. The reflectivity of the end face 42, (or both end faces (42,43)) is periodically modulated, using any of the periodic modulation structures described above, so as to bring about the conditions for coherent imaging and produce predominantly single, high-order waveguide mode operation.

Alternatively, a suitable lateral periodic modulation structure can be included as a separate element, together with separate resonator mirrors, in the manner illustrated in FIG. 2(a), in which case the end faces 42,43 of the slab waveguide may be anti-reflection coated to reduce optical losses. The solid state slab waveguide may be end-, side- or face-pumped by diode laser arrays, flashlamps or other suitable pump sources using appropriate coupling optics to couple the pump light into the slab waveguide. The solid state slab waveguide surfaces may be provided with suitable cladding, which may be dichroic, to enhance waveguiding action at both the pump and laser wavelengths.

The slab waveguide laser according to the first aspect of the present invention can be applied to broad area semiconductor diode lasers, whether electrically or optically pumped. It can also be applied to liquid slab dye lasers.

Figure 11:
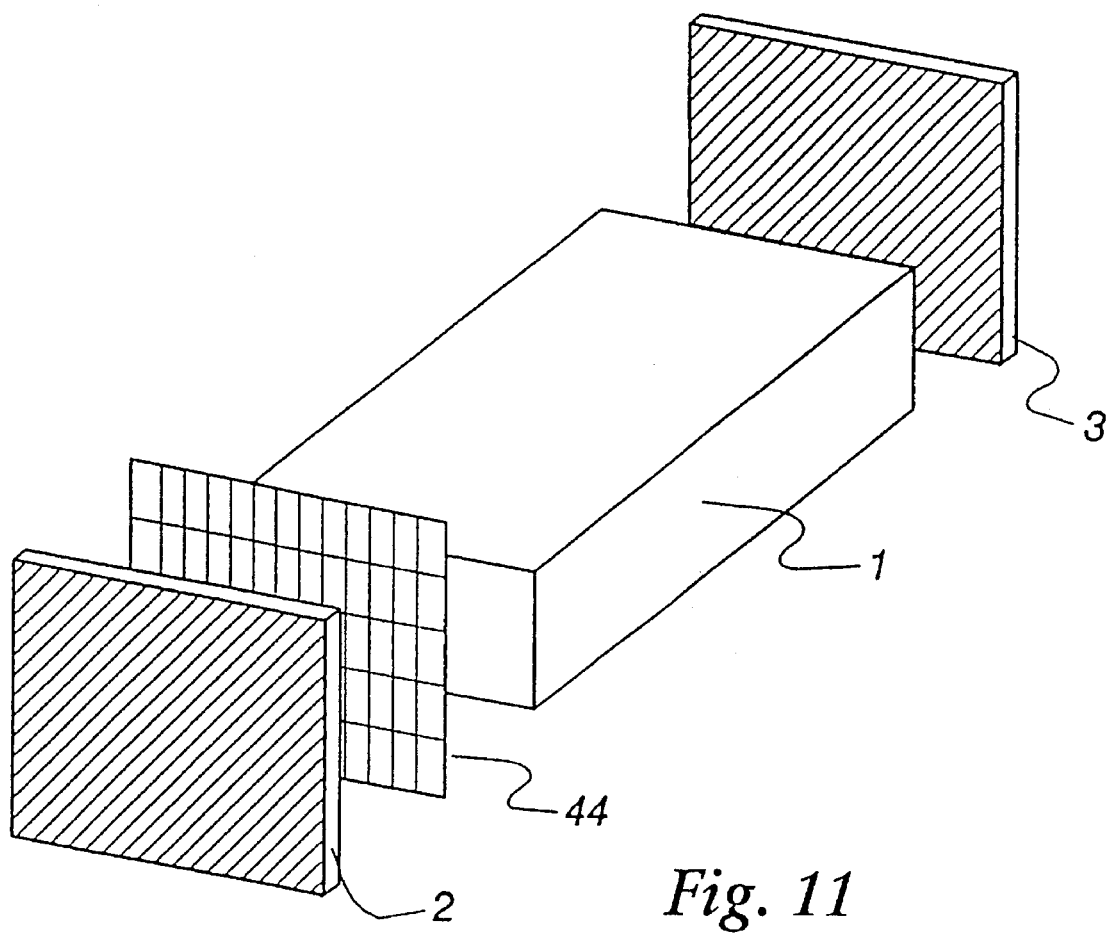
FIG. 11 shows a slab waveguide laser incorporating a periodic modulation structure in accordance with the first technique which takes the form of a two-dimensional wire grid.

In another embodiment of a slab waveguide laser in accordance with the first aspect of the present invention, the periodic modulation structure positioned 5 at or near the resonator mirrors 2,3 takes the form of a two-dimensional grid 44, as shown in FIG. 11, and is used when the thickness of the slab waveguide 1, is so large as to allow multiple waveguide mode operation in the transverse direction. The two-dimensional periodic modulation structure 44 can be produced in accordance with any of the designs described previously hereinabove for producing one-dimensional periodic modulation structures.

Figure 12A:
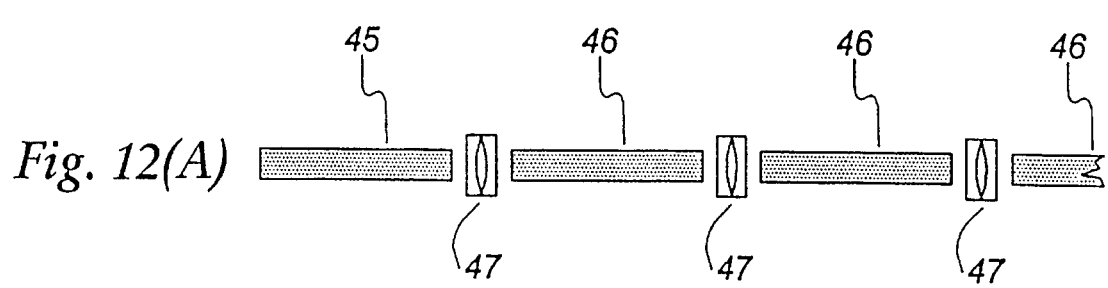
FIGS. 12(a) and (b) show two optical configurations employing multiple slab waveguide structures in series and parallel, respectively.

A laser system with multiple gain (high output power) may be produced by using two or more slab waveguides 45,46 arranged so as to be optically, if not physically, in series. In one such arrangement, shown in FIG. 12(a), the first slab waveguide 45, is configured as an oscillator in accordance with the first aspect of the present invention in which the transverse and lateral mode content is stabilized. The second and succeeding slab waveguides 46, are configured as optical amplifiers. The radiation emanating from the first slab waveguide 45, is imaged using a suitable optical element 47, onto the front optical plane of the following slab waveguide 46, with similar optical elements 47 being provided between successive slab waveguides 46. The optical length of the slab waveguides 46 configured as amplifiers is selected to be one or more multiples of the Talbot distance $Z_T$ for the oscillator configured around slab waveguide 45.

Figure 12B:
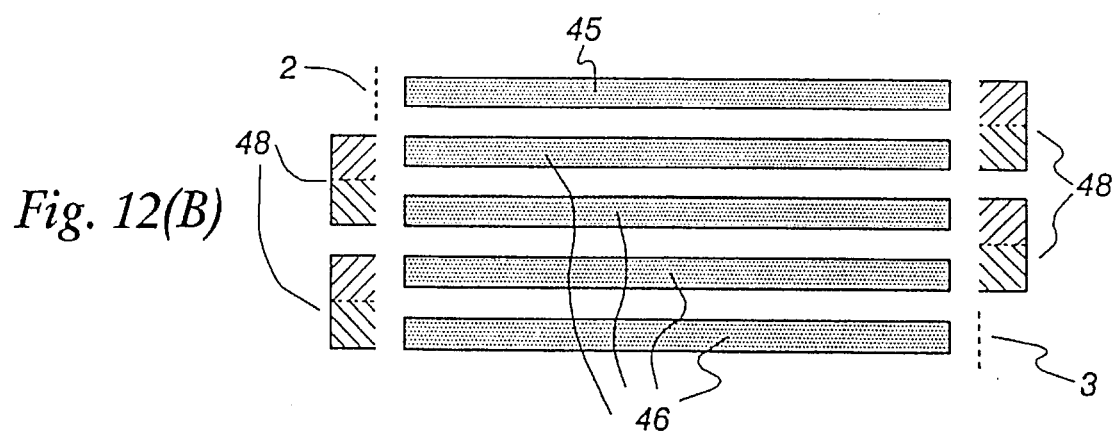

Two or more slab waveguides 45,46 can also be arranged geometrically in parallel, as illustrated in FIG. 12(b) where the slab waveguides 45,46 may be excited in series or parallel, and optically coupled in series, with appropriate folding and imaging optics 48. As shown in FIG. 12(b), radiation from a slab waveguide 45 configured as a mode stabilized oscillator in accordance with the first aspect of the present invention is imaged on to second and succeeding slab waveguides configured as amplifiers. Periodic modulation may be incorporated in each amplifier section with periodicity appropriate to satisfy the conditions for coherent imaging. By the inclusion of resonator mirrors 2 and 3, the parallel slab structure may be configured as a multi-slab oscillator whose mode structure is controlled in the same manner as the slab waveguide laser according to the first aspect of the present invention.

Figure 13A:
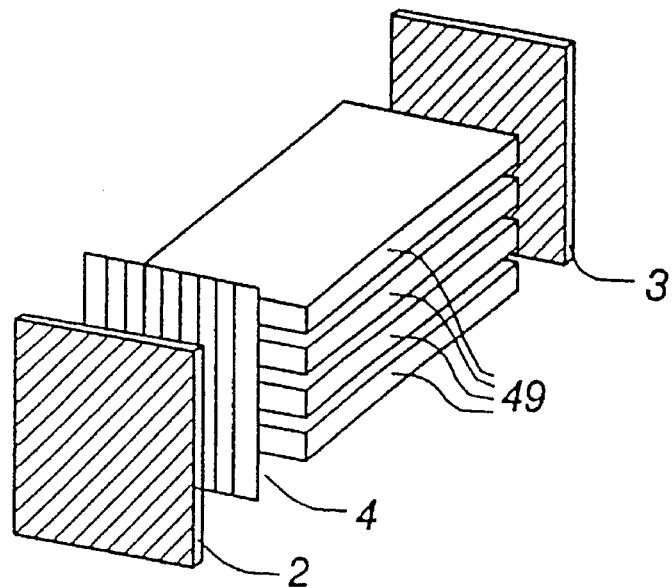
FIG. 13(a) shows a plurality of slab waveguide lasers which are arranged and mode stabilized in parallel.
Figure 13B:
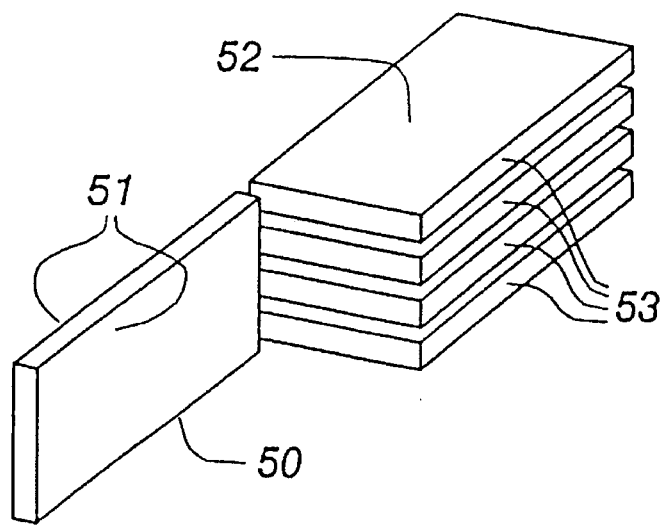
FIG. 13(b) shows a mode stabilized slab waveguide oscillator coupled into each of a plurality of parallel slab waveguides.

As shown in FIG. 13(a) a number of slab waveguides 49, may be arranged to be physically in parallel, with common resonator mirrors, 2,3 and a common periodic modulation structure 4. The dimensions of the periodic modulation structure 4 are chosen to match those of the slab waveguides 49 and to satisfy the conditions for coherent imaging outlined above. In a further embodiment, illustrated in FIG. 13(b), a single slab waveguide 50, configured as an oscillator whose transverse and lateral modes are stabilized using the 5 first or second techniques outlined above, is arranged to have its major planar surfaces 51, orthogonal to the major planar surfaces 52, of a series of parallel slab waveguides 53. The output from the mode stabilized slab oscillator 50 is optically coupled into the parallel slab waveguides 53 in such a manner as to simultaneously inject coherent light into each of the parallel slab waveguides 53, which may be configured as amplifiers, regenerative amplifiers or injection-locked oscillators, so producing a coherent output from the whole assembly.

Figure 14:
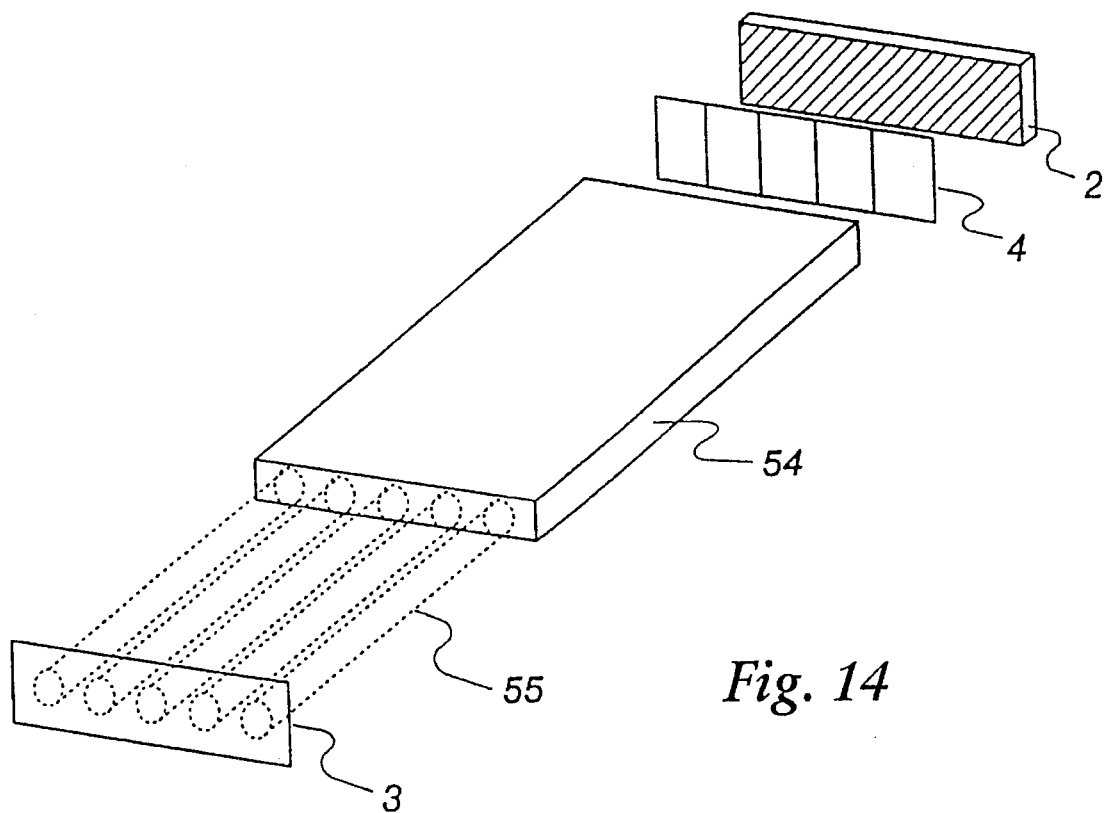
FIG. 14 shows a laser system in accordance with the second aspect of the present invention in which the principle of coherent imaging in a slab waveguide laser is applied to achieve phase-locking of a linear array of laser oscillators.

Referring now to FIG. 14 there is shown a laser system in accordance with the second aspect of the present invention. A slab waveguide structure 54, and a multi-element planar array of gain media 55 are situated in series within a laser cavity, bounded by two laser resonator mirrors 2,3. Disposed within the laser cavity between the slab waveguide 54 and the resonator mirror 2 is a periodic modulation structure which takes the form of a wire grid 4. The length of the slab waveguide 54, within the laser cavity is chosen to satisfy the conditions for coherent imaging, to produce a stable, phase-locked laser output. Within the slab waveguide structure 54, diffractive coupling of the respective outputs of the gain media 55 occurs under conditions of very low loss in both the transverse and lateral directions. Such low loss 5 coupling is essential for power efficient operation of coupled arrays, and represents a distinct advantage over the prior art which does make use of the Talbot effect to establish coherence across an array of lasers, but in highly lossy free-space, rather than in 10 a low loss slab waveguide structure. It will be understood that the wire grid is not essential to the operation of the laser system.

A variation on the laser system described with reference to FIG. 14, uses a slab waveguide structure 54, not only to provide a region of very low loss diffractive coupling, but also as an intra-cavity region with optical gain. This is accomplished by providing either electric discharge, optical or some other form of excitation to the slab waveguide structure 54 which simultaneously provides a low loss diffractive coupling region for the purpose of phaselocking an array of gain media.

Figure 15:
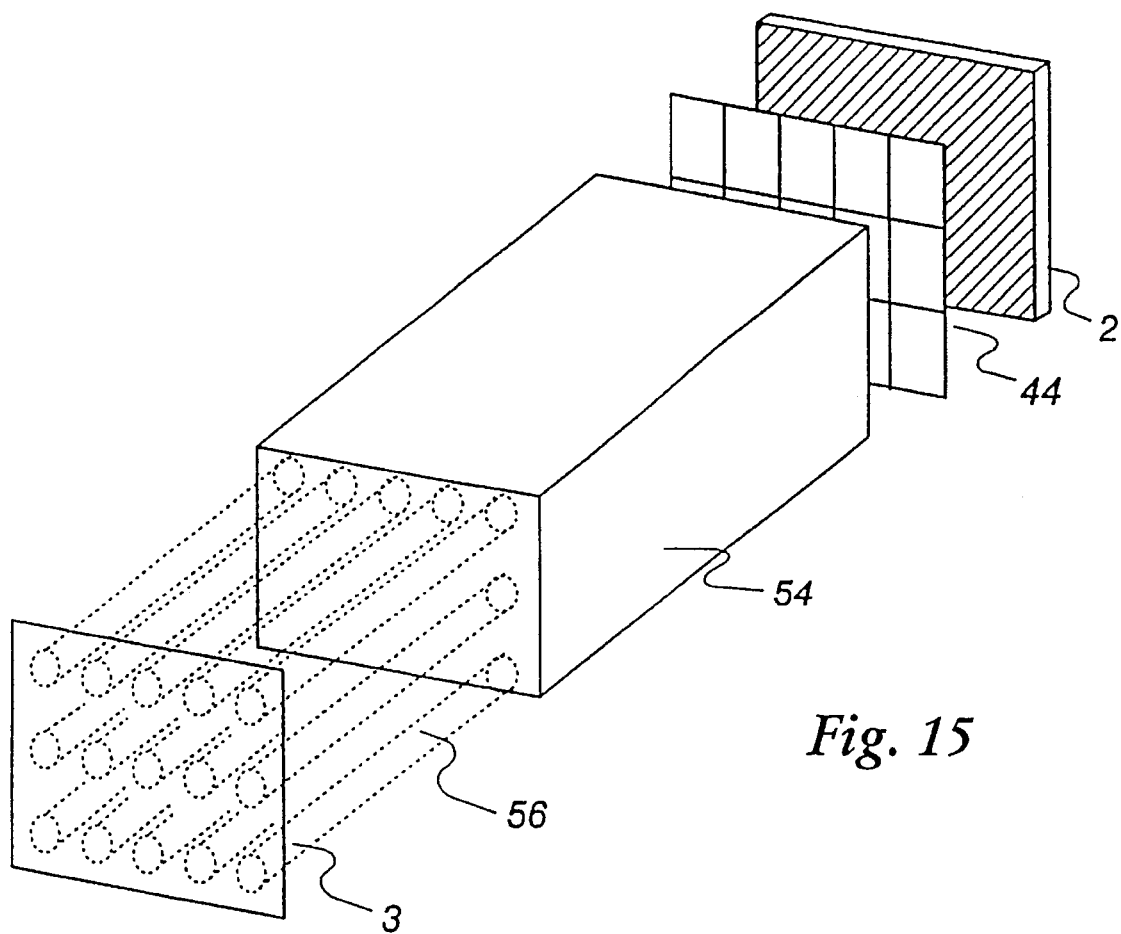
FIG. 15 shows another laser system in accordance with the second aspect of the present invention in which the principle of coherent imaging in a slab waveguide is applied to achieve phase-locking of a two-dimensional array of laser oscillators.

FIG. 15 shows another embodiment of the laser system in accordance with the second aspect of the present invention. As shown in FIG. 15, the slab waveguide structure 54, is applied to the phase-locking of a two-dimensional multi-element array of gain media 56. In all essentials this embodiment is identical to that of FIG. 14, except that the slab waveguide is dimensioned to satisfy the conditions for coherent imaging both transversely and laterally. As such the predominant mode $EH_{pq}$ of the slab waveguide matches the periodicity of the array. A two-dimensional periodic modulation structure 44, as previously described is located at one end of the slab waveguide 54, but its presence is not essential.

We claim:

1. A slab waveguide laser which operates in a predominantly single, high-order mode, comprising:

a slab waveguide (1) including a rectangular slab-shaped gain medium having two orthogonal pairs of parallel side walls reflective at a wavelength of the laser and respectively define a width in a lateral direction and a thickness in a transverse direction of the slab waveguide, two parallel end faces that are orthogonal to the side walls, and a main optical axis running parallel to the side walls;

two laser resonator mirrors (2,3), at least one of which is partially transmitting, positioned adjacent to a respective end face of the slab waveguide orthogonal to the main optical axis to define therebetween a laser resonator; and a periodic modulation structure (4) positioned within the laser resonator and orthogonal to the main optical axis of the slab waveguide and including a plurality of spaced apertures, with at least one direction of periodic modulation parallel to the lateral direction of the slab waveguide, wherein a length L of the slab is defined by:

$$L = m \frac{n d^2}{2\lambda}$$

where m is a positive integer, d is a spacing of the apertures in the periodic modulation structure, λ is the wavelength of the laser and n is a refractive index of the gain medium, and wherein the width of the slab waveguide is an integer multiple of the aperture spacing d.

2. A slab waveguide laser according to claim 1, wherein the thickness of the slab waveguide (1) ensures operation in a fundamental mode in the transverse direction.

3. A slab waveguide laser according to claim 2, wherein the number of apertures in the periodic modulation structure (4) in the lateral direction is less than an integer number obtained by dividing the width of the slab waveguide (1) by a periodicity of the periodic modulation structure (4).

4. A slab waveguide laser according to claim 1, wherein the thickness of the slab waveguide (1) is greater than a thickness necessary to ensure operation in the fundamental mode in the transverse direction, and the periodic modulation structure (4) has plural dimensions having periodicity in two orthogonal directions.

5. A slab waveguide laser according to claim 1, wherein the aperture spacing is adjusted to compensate for optical non-uniformities in the gain medium.

6. A slab waveguide laser according to claim 5, wherein the periodic modulation structure (5,6,7,8) is coincident with a major planar face (11,12) of the slab waveguide (1).

7. A slab waveguide laser according to claim 6, wherein the periodic modulation structure (5,6,7,8) comprises parallel lines (6) extending in a direction parallel to the main optical axis along the length of the slab waveguide (1).

8. A slab waveguide laser according to claim 7, wherein the parallel lines (6) are divided into short spaced-apart zones along the length of the waveguide slab (1) in the direction parallel to the main optical axis, said zones being spaced by a distance equal to half a Talbot distance $Z_T$ defined by equation $Z_T = 2nd^2/\lambda$ or integer multiples thereof.

9. A slab waveguide laser according to claim 7, wherein the parallel lines (6) comprise grooves (8) in at least one of major planar surface of the slab waveguide.

10. A slab waveguide laser according to claim 7, wherein the lines (6) comprise raised sections (6) on at least one of the major planar surfaces of the slab waveguide.

11. A slab waveguide laser according to claim 1, wherein the periodic modulation structure (4) is positioned between an end face of the slab waveguide (1) and one of the laser resonator mirrors (2,3).

12. A slab waveguide laser according to claim 11, wherein the periodic modulation structure (4) comprises a grid of parallel wires.

13. A slab waveguide laser according to claim 11, wherein the periodic modulation structure (4) comprises a grid of parallel thin plates or foils aligned parallel to the main optical axis of the slab waveguide.

14. A slab waveguide laser according to claim 11, wherein the periodic modulation structure (4) comprises a grid of parallel lines (31) formed on a surface of one of the laser resonator mirrors (2,3).

15. A slab waveguide laser according to claim 11, wherein the periodic modulation structure (4) comprises a grid of lines, which are formed on the surface of an optically transparent window positioned within the slab waveguide.

16. A slab waveguide laser according to claim 11, wherein the gain medium is solid state and the periodic modulation structure (4) comprises a grid of parallel lines formed on an end surface (42,43) of the slab waveguide (1).

17. A slab waveguide laser according to claim 11, wherein a reflectivity of one of the laser resonator mirrors (2,3) is periodically varied to form the periodic modulation structure (32,33).

18. A slab waveguide laser according to claim 1, further comprising:

a plurality of slab waveguides (45,46) arranged optically in series with an output face of one of the plurality of slab waveguides optically imaged onto to the input face of a next one of the plurality of slab waveguides, with each of the pair of laser resonator mirrors (2,3) positioned at a respective end of the series of slab waveguides.

19. A laser system for providing phase-locked operation of an array of laser oscillators, comprising:

a multi-element array of gain media (55) having outputs that lie in a common output plane;

a slab waveguide (54) including a slab-shaped medium, one end of which is positioned adjacent to the common output plane; and first and second laser resonator mirrors (2,3), the first mirror being positioned adjacent to a distal end face of the slab waveguide and the second mirror being positioned adjacent to a distal end face of the said multi-element array, wherein side walls of the slab waveguide are reflective at a wavelength of the laser to provide a region of diffractive coupling of radiation emitted from said multi-element array at low optical loss in both transverse and lateral directions of the slab waveguide, and wherein a distance L (wavelength) between the output plane and the first mirror is defined by:

$$L(\text{waveguide}) = m \frac{n d^2}{2\lambda}$$

where m is a positive integer, d is a spacing of the gain media in the multi-element array, $\lambda$ is the laser wavelength and n is a refractive index of the slab waveguide.

20. A laser system according to claim 19, wherein a periodic modulation structure of a same periodicity as the multi-element array is positioned between the distal end of the slab waveguide and the laser resonator mirror adjacent thereto with an axis of periodicity parallel to the multi-element array.

21. A laser system according to claim 19, wherein the slab waveguide provides optical gain at a wavelength of the gain media in the multi-element array.

22. A laser system according to claim 19, wherein the slab waveguide exhibits gain at a wavelength of the multi-element array.

23. A laser system according to claim 19, wherein the multi-element array of gain media is a two-dimensional array and dimensions of the slab waveguide provide efficient coherent imaging of the array simultaneously in both directions.

* * * * *